(12) United States Patent
Kosmowski et al.

(10) Patent No.: US 7,760,331 B2
(45) Date of Patent: Jul. 20, 2010

(54) DECOUPLED, MULTIPLE STAGE POSITIONING SYSTEM

(75) Inventors: Mark T. Kosmowski, Beaverton, OR (US); Kelly Bruland, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 821 days.

(21) Appl. No.: 11/676,937

(22) Filed: Feb. 20, 2007

(65) Prior Publication Data

US 2008/0196631 A1 Aug. 21, 2008

(51) Int. Cl.
*G03B 27/58* (2006.01)

(52) U.S. Cl. .......................................... 355/72; 355/53

(58) Field of Classification Search ................. 355/53, 355/753, 72, 752; 356/244; 108/20; 257/E21.001; 310/12.06, 12.19; 219/121.85, 121.6; 359/509
See application file for complete search history.

(56) References Cited

U.S. PATENT DOCUMENTS

| 4,761,876 A | 8/1988 | Kosmowski |
| 4,869,626 A | 9/1989 | Kosmowski |
| 4,922,603 A | 5/1990 | Kosmowski |

OTHER PUBLICATIONS

U.S. Appl. No. 11/676,945, filed Feb. 20, 2007, for Air Bearing Assembly for Guiding Motion of Optical Components of a Laser Processing System.
U.S. Appl. No. 11/747,118, filed May 10, 2007, for Specimen Inspection Stage Implemented With Processing Stage Coupling Mechanism.

*Primary Examiner*—Alan A Mathews
*Assistant Examiner*—Mesfin T Asfaw
(74) *Attorney, Agent, or Firm*—Stoel Rives LLP

(57) ABSTRACT

A split axis stage architecture is implemented as a multiple stage positioning system that is capable of vibrationally and thermally stable material transport at high speed and rates of acceleration. A split axis design decouples stage motion along two perpendicular axes lying in separate, parallel planes. A dimensionally stable substrate in the form of a granite, or other stone slab, or of ceramic material or cast iron, is used as the base for lower and upper stages. The substrate is precisely cut ("lapped") such that its upper and lower stage surface portions are flat and parallel to each other.

27 Claims, 6 Drawing Sheets

DECOUPLED, MULTIPLE STAGE POSITIONING SYSTEM

COPYRIGHT NOTICE

©2007 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71 (d).

TECHNICAL FIELD

The present disclosure relates to specimen processing systems and, in particular, to stage architecture for control of two- or three-dimensional positioning of a processing device relative to a target specimen.

BACKGROUND INFORMATION

Wafer transport systems configured for use in semiconductor wafer-level processing typically include a stage having a chuck that secures the wafer for processing. Sometimes the stage is stationary, and sometimes it is moveable. Some applications require that the stage move linearly in one, two, or three Cartesian dimensions, with or without rotation. The speed of the stage motion can dictate the throughput of the entire wafer processing platform if a significant amount of the total process time is spent aligning and transporting the wafer.

For applications including optical processing, a moveable optics assembly can be mounted above the wafer surface, thereby minimizing the wafer transport distances required. The primary direction of stage motion is referred to as the "major axis," and the direction of stage motion perpendicular to the primary direction is referred to as the "minor axis." The chuck holding the wafer, or specimen, to be processed may be mounted to a major axis stage for movement along the major axis, a minor axis stage for movement along the minor axis, or in stationary position below the major and minor axes. The major axis stage may support the minor axis stage, or they may be independent of each other.

Stage design of such optical systems is becoming more critical as electrical circuit dimensions shrink. One stage design consideration is the impact of process quality stemming from vibrational and thermal stability of the wafer chuck and optics assembly. In the case in which the laser beam position is continually adjusted, state-of-the-art structures supporting the laser assembly are too flexible to maintain the required level of precision. Moreover, as circuit dimensions shrink, particle contamination becomes of greater concern.

SUMMARY OF THE DISCLOSURE

A "split axis stage" architecture is implemented as a multiple stage positioning system that, in a preferred embodiment, supports a laser optics assembly and a workpiece having a surface on which a laser beam is incident for laser processing. The multiple stage positioning system is capable of vibrationally and thermally stable material transport at high speed and rates of acceleration. A "split axis" design decouples driven stage motion along two perpendicular axes lying in separate, parallel planes. In a preferred embodiment, motion in the horizontal plane is split between a specimen (major axis or lower) stage and a scan optics assembly (minor axis or upper) stage that move orthogonally relative to each other.

A dimensionally stable substrate in the form of a granite, or other stone slab, or a slab of ceramic material, cast iron, or polymer composite material such as Anocast™, is used as the base for the lower and upper stages. The slab and the stages are preferably fabricated from materials with similar coefficients of thermal expansion to cause the system to advantageously react to temperature changes in a coherent fashion. The substrate is precisely cut ("lapped") such that portions of its upper and lower stage surfaces are flat and parallel to each other. In a preferred embodiment, a lower guide track assembly that guides a lower stage carrying a specimen-holding chuck is coupled to a lower surface of the substrate. An upper guide track assembly that guides an upper stage carrying a laser beam focal region control subsystem is coupled to an upper surface of the substrate. Linear motors positioned along adjacent rails of the guide track assemblies control the movements of the lower and upper stages.

The massive and structurally stiff substrate isolates and stabilizes the motions of the laser optics assembly and the specimen, absorbs vibrations, and allows for smoother acceleration and deceleration because the supporting structure is inherently rigid. The stiffness of the substrate and close separation of the stage motion axes result in higher frequency resonances, and less error in motion along all three axes. The substrate also provides thermal stability by acting as a heat sink. Moreover, because it is designed in a compact configuration, the system is composed of less material and is, therefore, less susceptible to expansion when it undergoes heating. An oval slot cut out of the middle of the substrate exposes the specimen below to the laser beam and allows for vertical motion of the laser optics assembly through the substrate. Otherwise, the specimen is shielded by the substrate from particles generated by overhead motion, except for the localized region undergoing laser processing.

A laser beam focal region control subsystem is supported above the lower stage and includes a vertically adjustable optics assembly positioned within a rigid air bearing sleeve mounted to the upper stage by a support structure. The rigidity of the support structure allows for faster and more accurate vertical motion along the beam axis. The inner surface of the sleeve acts as an outer race, and the outer surface of the lens acts as an inner race, thus forming an air bearing guiding the vertical motion of the focal region of the laser beam. Vertical motion is initiated by a lens forcer residing at the top end of the sleeve, which imparts a motive force to the optics assembly to adjust its height relative to the workpiece on the lower chuck, and in so doing, adjusts the focal region of the laser relative to the work surface. An isolation flexure device, rigid along the beam axis and compliant in the horizontal plane, buffers excess motion of the lens forcer from the optics assembly.

The split axis stage design is applicable to many platforms used in semiconductor processing including dicing, component trim, fuse processing, inking, printed wire board (PWB) via drilling, routing, inspection, and metrology. The advantages afforded by such a design are also of benefit to a whole class of mechanical machining tools.

Additional aspects and advantages will be apparent from the following detailed description of preferred embodiments, which proceeds with reference to the accompanying drawings.

DETAILED DESCRIPTION OF PREFERRED EMBODIMENTS

Figure 1:
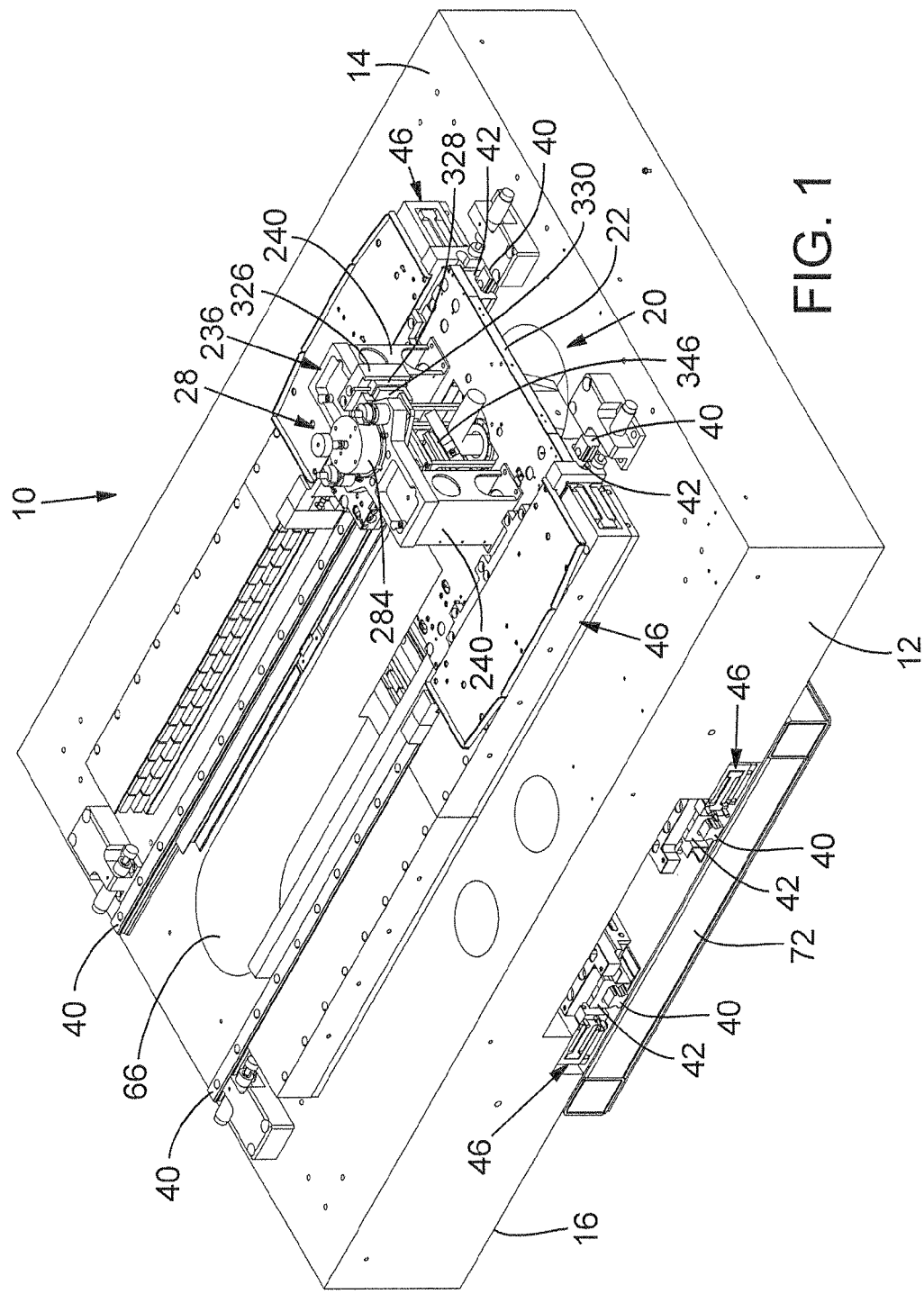
FIG. 1 is an isometric view of a decoupled, multiple stage positioning system.
Figure 2:
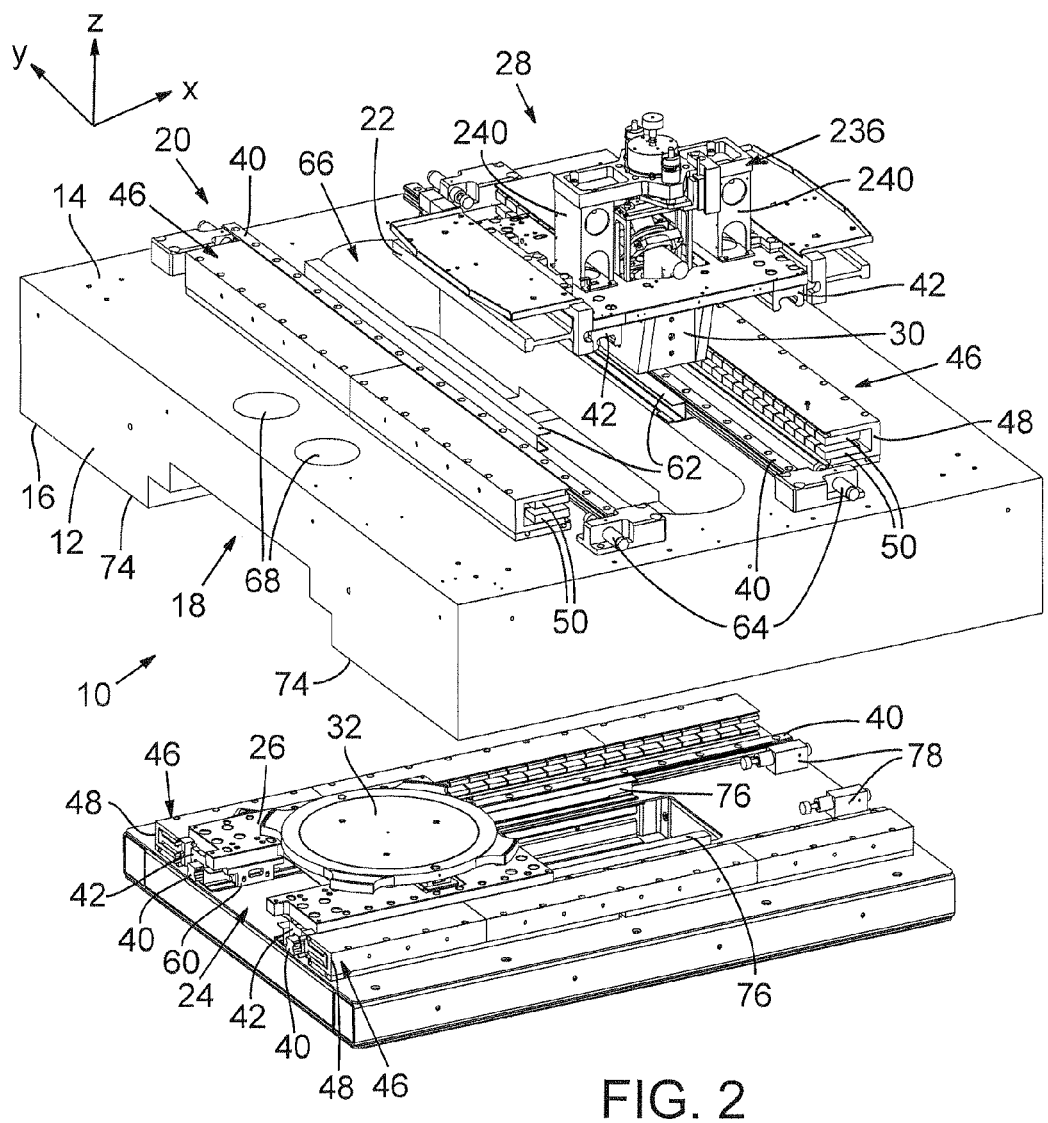
FIG. 2 is a partly exploded isometric view of the positioning system of FIG. 1, showing upper and lower stages that, when the system is assembled, are mounted to a dimensionally stable substrate such as a stone slab.

FIGS. 1 and 2 show a decoupled, multiple stage positioning system 10, which, in a preferred embodiment, supports components of a laser processing system through which a laser beam propagates for incidence on a target specimen. Positioning system 10 includes a dimensionally stable substrate 12 made of a stone slab, preferably formed of granite, or a slab of ceramic material, cast iron, or polymer composite material such as Anocast™. Substrate 12 has a first or upper flat major surface 14 and a second or lower flat major surface 16 that has a stepped recess 18. Major surfaces 14 and 16 include surface portions that are plane parallel to each other and conditioned to exhibit flatness and parallelism within about a ten micron tolerance.

A surface portion of upper major surface 14 and a first guide track assembly 20 are coupled to guide movement of a laser optics assembly stage 22 along a first axis, and a surface portion of lower major surface 16 and a second guide track assembly 24 are coupled to guide movement of a specimen stage 26 along a second axis that is transverse to the first axis. Optics assembly stage 22 supports a laser beam focal region control subsystem 28, which includes a scan lens 30 that depends downwardly below lower major surface 16 of substrate 12. Specimen stage 26 supports a specimen-holding chuck 32. The guided motions of stages 22 and 26 move scan lens 30 relative to laser beam processing locations on a surface of a specimen (not shown) held by chuck 32.

In a preferred implementation, substrate 12 is set in place so that major surfaces 14 and 16 define spaced-apart horizontal planes and guide track assemblies 20 and 24 are positioned so that the first and second axes are perpendicular to each other and thereby define respective Y- and X-axes. This split axis architecture decouples motion along the X- and Y-axes, simplifying control of positioning the laser beam and chuck 32, with fewer degrees of freedom allowed.

Figure 3:
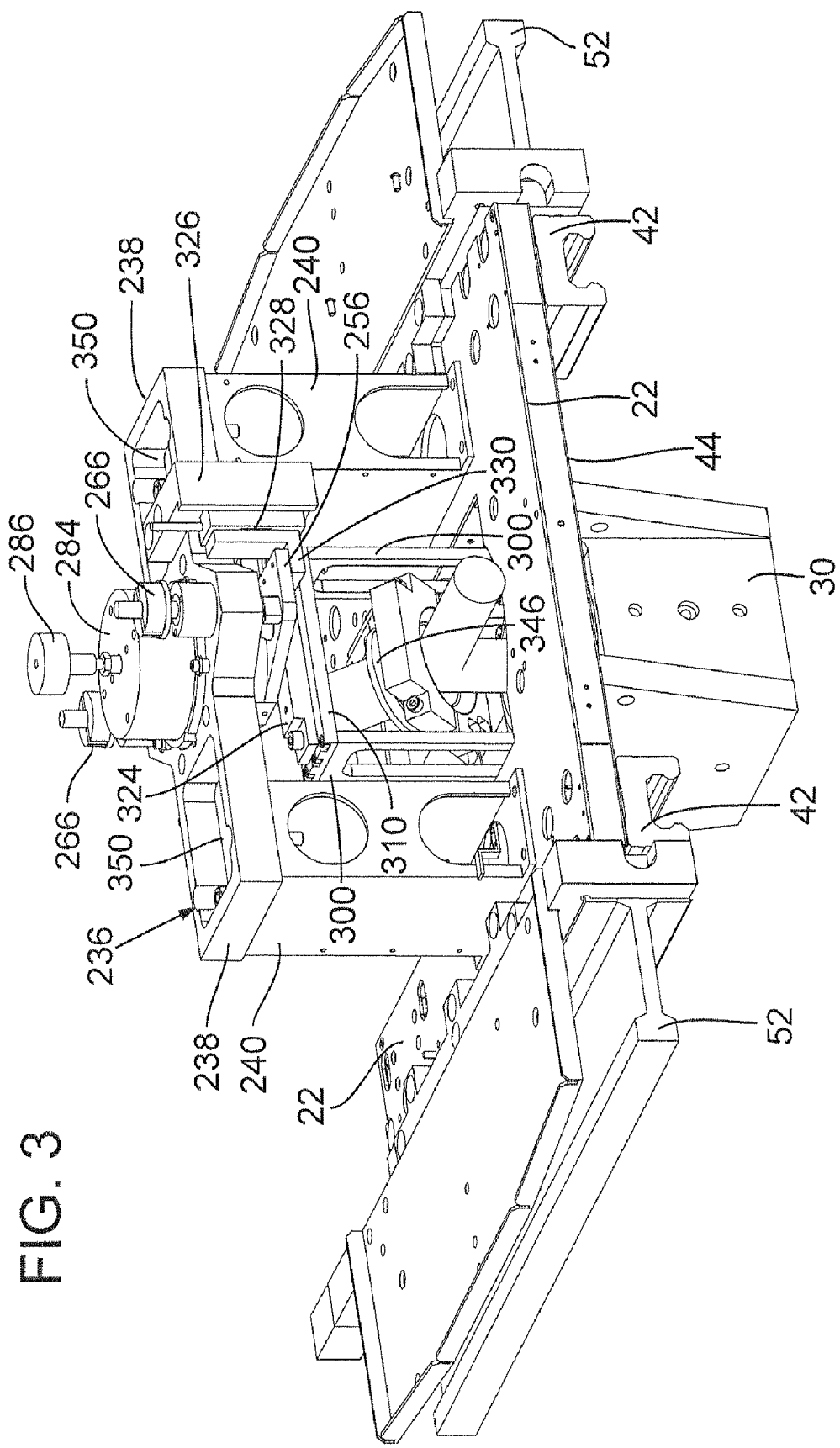
FIG. 3 is an isometric view of the positioning system of FIG. 1, showing the upper stage supporting a scan lens and upper stage drive components.

FIG. 3 shows in detail optics assembly stage 22, which operates with first guide track assembly 20 shown in FIG. 2. First guide track assembly 20 includes two spaced-apart guide rails 40 secured to support portions of upper major surface 14 and two U-shaped guide blocks 42 supported on a bottom surface 44 of optics assembly stage 22. Each one of guide blocks 42 fits over and slides along a corresponding one of rails 40 in response to an applied motive force. A motor drive for optics assembly stage 22 includes a linear motor 46 that is mounted on upper major surface 14 and along the length of each guide rail 40. Linear motor 46 imparts the motive force to propel its corresponding guide block 42 for sliding movement along its corresponding guide rail 40. Each linear motor 46 includes a U-channel magnet track 48 that holds spaced-apart linear arrays of multiple magnets 50 arranged along the length of guide rail 40. A forcer coil assembly 52 positioned between the linear arrays of magnets 50 is connected to bottom surface 44 of optics assembly stage 22 and constitutes the movable member of linear motor 46 that moves optics assembly stage 22. A suitable linear motor 46 is a Model MTH480, available from Aerotech, Inc., Pittsburgh, Pa.

Each rail guide 40—guide block 42 pair of first guide track assembly 20 shown in FIG. 2 is a rolling element bearing assembly. Alternatives for guide track assembly 20 include a flat air bearing or a vacuum preloaded air bearing. Use of either type of air bearing entails removal of each guide rail 40, exposing the surface portions of upper surface 14 to form guide surfaces, and substitution for each guide block 42 the guide surface or bearing face of the bearing, which is attached to bottom surface 44 of laser optics assembly stage 22. Vacuum preloaded air bearings, which have a pressure port and a vacuum port, hold themselves down and lift themselves off the guide surface at the same time. Use of vacuum preloaded air bearings needs only one flat guide surface; whereas use of opposed bearing preloading needs two flat, parallel guide surfaces. Suitable air bearings are available from New Way Machine Components, Inc., Aston, Pa. Thus, depending on the type of guide track assembly used, surface portions of upper major surface 14 may represent a guide rail mounting contact surface or a bearing face noncontacting guide surface.

A pair of encoder heads 60 secured to bottom surface 44 of optics assembly stage 22 and positioned adjacent different ones of guide blocks 42 includes position sensors that measure yaw angle and distance traveled of optics assembly stage 22. Placement of the position sensors in proximity to guide rails 40, guide blocks 42, and linear motors 46 driving each of stages 22 and 26 ensures efficient, closed-loop feedback control with minimal resonance effects. A pair of stop members 62 limits the travel distance of guide blocks 42 in response to limit switches included in encoder heads 60 that are tripped by a magnet (not shown) attached to substrate 12. A pair of dashpots 64 dampen and stop the motion of optics assembly stage 22 to prevent it from overtravel movement off of guide rails 40.

An oval slot 66 formed in substrate 12 between and along the lengths of guide rails 40 provides an opening within which scan lens 30 can travel as optics assembly stage 22 moves along guide rails 40. A pair of through holes 68 formed in the region of stepped recess 18 in substrate 12 provides operator service access from upper surface 14 to encoder heads 60 to maintain their alignment.

Figure 4:
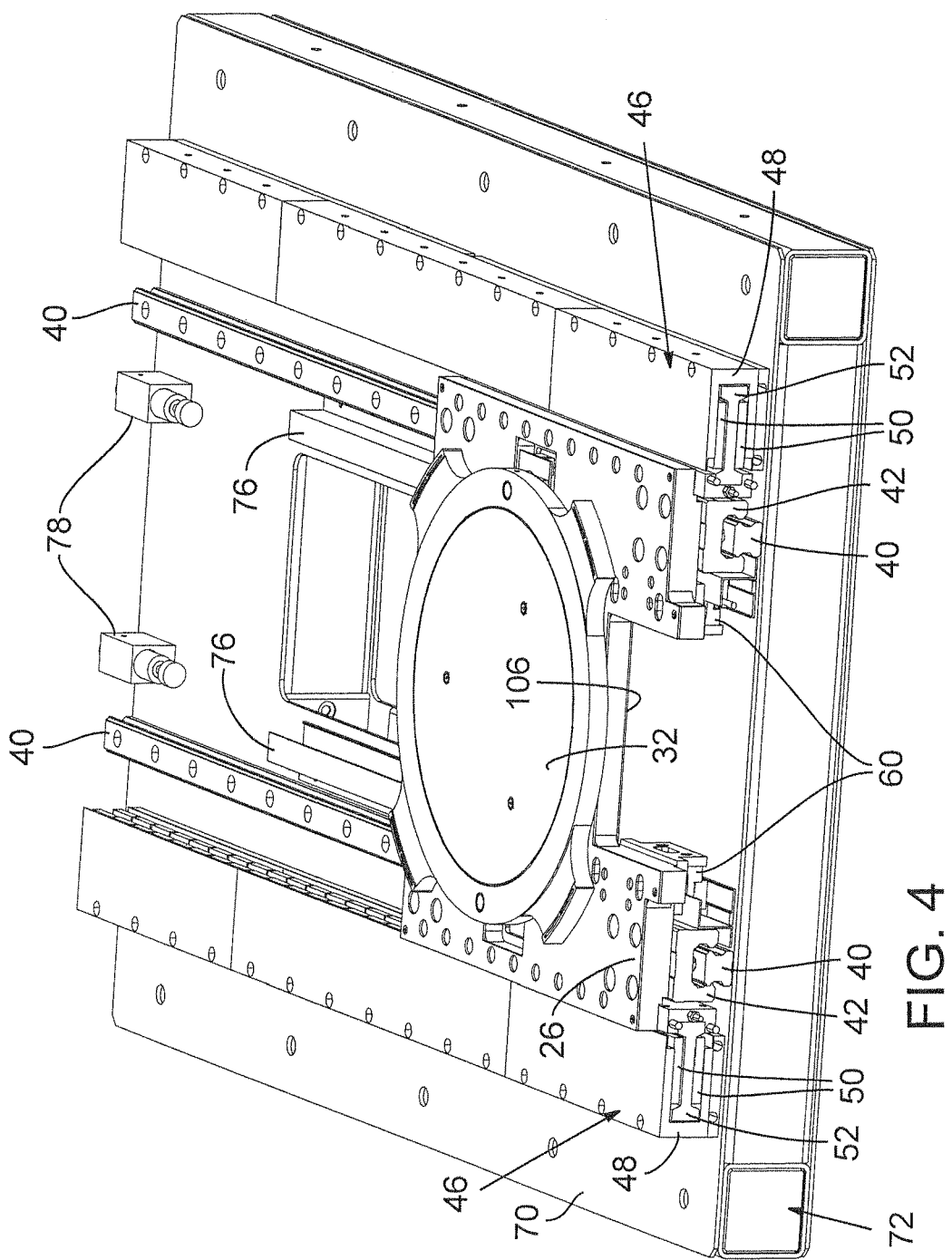
FIG. 4 is an isometric view of the positioning system of FIG. 1, showing the lower stage supporting a specimen-holding chuck and lower stage drive components.

FIG. 4 shows in detail specimen stage 26 in operative association with second guide track assembly 24 of FIG. 2. Second guide track assembly 24 includes guide rails, U-shaped guide blocks, linear motors, U-channel magnet tracks, magnets, forcer coil assemblies, and encoder heads that correspond to and are identified by the same reference numerals as those described above in connection with first guide track assembly 20. Linear motors 46 and the components of and components supported by second guide track assembly 24 are mounted on a surface 70 of a specimen stage bed 72.

The mechanical arrangement of stages 22 and 26 and motors 46 results in reduced pitch and roll of stages 22 and 26, and enhances accuracy of high velocity motion. Symmetric placement of motors 46 on opposite sides of stages 22 and 26 improves control of yaw. The placement of motors 46 along the sides of stages 22 and 26, as opposed to underneath them, minimizes thermal disturbance of critical components and position sensors.

Second guide track assembly 24 and specimen stage 26 supporting chuck 32 fits into and is secured within stepped recess 18. Surface 70 of specimen stage bed 72 is secured against a surface portion 74 of lower major surface 16 adjacent the wider, lower portion of stepped recess 18, and chuck 32 is positioned below the innermost portion of stepped recess 18 of lower major surface 16 and moves beneath it in response to the motive force imparted by linear motors 46 moving specimen stage 26 along second guide track assembly 24. A pair of stop members 76 limits the travel distance of guide blocks 42 in response to limit switches included in encoder heads 60 that are tripped by a magnet (not shown) attached to substrate 12. A pair of dashpots 78 dampen and stop the motion of specimen stage 26 to prevent it from overtravel movement off of guide rails 40.

A first alternative to guide track assembly 24 is a magnetic preloaded air bearing using specimen stage bed 72 as a bearing land or guideway. Use of a magnetic preloaded air bearing entails removal of each guide rail 40, exposing the surface portions of specimen stage bed 72, and the removal of each guide block 42, providing on the bottom surface of specimen stage 26 space for mounting the air bearing with its (porous) bearing face positioned opposite the exposed surface portion.

Figure 5A:
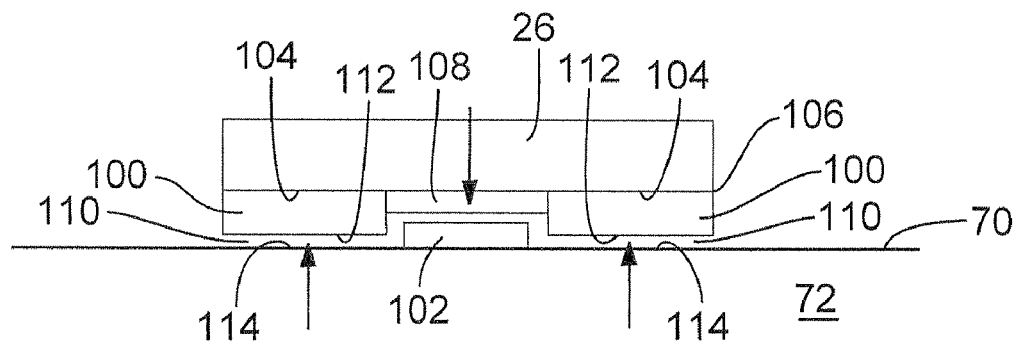
FIGS. 5A, 5B, and 5C are diagrams showing alternative guide track assembly configurations for moving one or both of the upper and lower stages of the positioning system of FIGS. 1-4.

FIG. 5A is a schematic diagram showing the placement of two magnetic preloaded air bearings 100 in the this first alternative arrangement. A steel plate, or steel laminate structure 102, is fixed on surface 70 in the space between and along the lengths of forcer coil assemblies 52. Two spaced-apart flat air bearings 100 are fixed to corresponding surface portions 104 of a bottom surface 106 of specimen stage 26 and run along the lengths of linear motors 46. A suitable air bearing is a silicon carbide porous media flat bearing series Part No. S1xxxxx, available from New Way Machine Components, Inc., Aston, Pa. A sheet magnet 108 is positioned in the space between air bearings 100 on bottom surface 106 of specimen stage 26 and spatially aligned with steel plate 102 so that the exposed surfaces of magnet 108 and steel plate 102 confront each other. The magnetic force of attraction urges sheet magnet 108 downwardly toward steel plate or steel laminate 102 as indicated by the downward pointing arrow in FIG. 5A, and the net force of air bearings 100 urges specimen stage 26 upwardly away from surface 70 from specimen stage bed 72, as indicated by two parallel upward pointing arrows in FIG. 5A. The simultaneous application of opposed magnetic force and pressurized air creates a thin film of air in spaces 110 between (porous) bearing faces 112 of air bearings 100 and bearing guideways 114 on surface 70. The lift force of air bearings 100 equals twice the sum of the weight of specimen stage 26 and the magnetic force of magnet 108. Linear motors 46 impart the motive force that results in nearly zero friction motion of specimen stage 26 along the lengths of bearing guideways 114.

A second alternative to guide track assembly 24 is a vacuum preloaded air bearing using specimen stage bed 72 as a bearing land or guideway. Similar to the above-described first alternative to guide track assembly 20, use of a vacuum preloaded air bearing entails removal of each guide rail 40, exposing surface portion 114 of specimen stage bed 72, and the removal of each guide block 42, providing on bottom surface 106 of specimen stage 26 space for mounting the vacuum loaded air bearing, with its pressure land positioned opposite exposed surface portion 114.

Figure 5B:
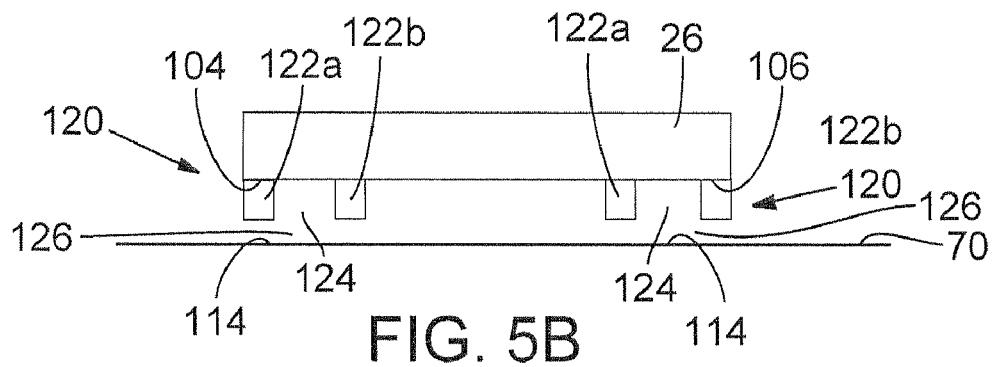

FIG. 5B is a schematic diagram showing the placement of two vacuum preloaded air bearings 120 in the second alternative arrangement. Two spaced-apart vacuum preloaded air bearings 120 are fixed to corresponding surface portions 104 of bottom surface 106 of specimen stage 26 and run along the lengths of linear motors 46. A suitable air bearing is a vacuum preloaded air bearing series Part No. S20xxxx, available from New Way Machine Components, Inc., Aston, Pa. Vacuum preloaded bearings 120 simultaneously hold themselves down and lift themselves off bearing guideways 114 on surface 70. Each vacuum preloaded bearing 120 has a pressure land that is divided into spaced-apart land portions 122a and 122b. A vacuum area 124 is located between land portions 122a and 122b. The simultaneous application and distribution of air pressure and vacuum pressure creates a thin film of air in spaces 126 between pressure land portions 122a and 122b of vacuum preloaded air bearings 120 and bearing guideways 114 on surface 70. Linear motors 46 impart the motive force that results in nearly zero friction motion of specimen stage 26 along the lengths of the bearing guideways 114.

A third alternative to guide track assembly 24 entails the use of either a magnetic preloaded air bearing of the first alternative, or a vacuum preloaded air bearing of the second alternative in the absence of specimen stage bed 72, as well as each guide rail 40 and each guide block 42.

Figure 5C:
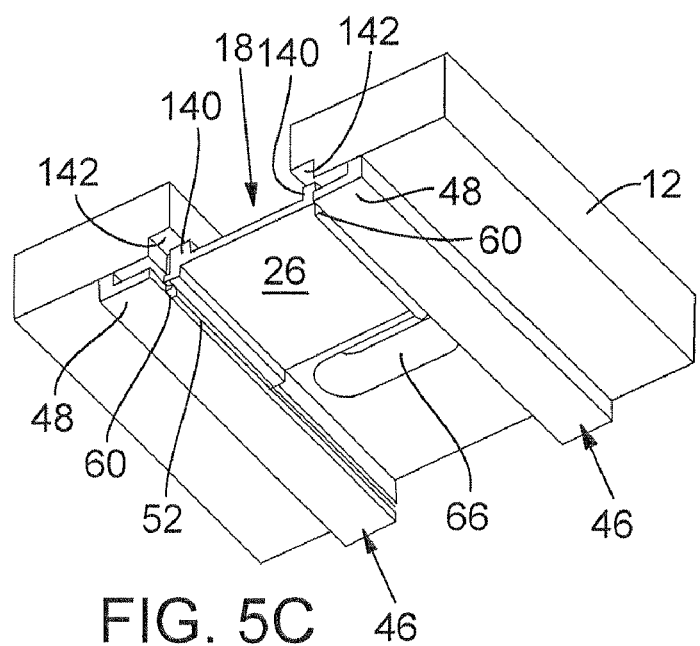

FIG. 5C is a schematic diagram showing specimen stage 26 riding on magnetic preloaded air bearings or vacuum preloaded air bearings 140 along bottom surface 142 of substrate 12. When substrate 12 is in a horizontal disposition, magnetic preloaded or vacuum preloaded air bearings 140 develop sufficient force to overcome the gravitational force on specimen stage 26 as it rides along bottom surface 142. Skilled persons will appreciate that laser optics assembly stage 22 can similarly be adapted to ride on magnetic preloaded air bearings or vacuum preloaded air bearings along upper major surface 14 of substrate 12. The stage configuration can use mechanical linear guides in place of the air bearings described above. Other devices for measuring position, such as interferometers, can be implemented in this positioning system design.

The mass of substrate 12 is sufficient to decouple the mass of optics assembly stage 22 and the mass of specimen stage 26, including the specimen mounted on it, so that the guided motion of one of stages 22 and 26 contributes a negligible motive force to the other one of them. The masses of stages 22 and 26 moving along the X- and Y-axes are low, and thereby allow high acceleration and high velocity processing and limit heat generation in linear motors 46. Because the center of mass of the laser beam focal region control subsystem 28 is aligned with the center of mass of optics assembly stage 22, perturbations in the motion of optics assembly stage 22 are minimized.

Laser optics assembly stage 22 has an opening 200 that receives control subsystem 28, which includes an air bearing assembly 202 containing scan lens 30. Control subsystem 28 controls the axial position of a laser beam focal region formed by scan lens 30 as the laser beam propagates generally along a beam axis 206, which is the optic axis of scan lens 30, and through scan lens 30 for incidence on a work surface of a target specimen supported on specimen stage 26.

Figure 6:
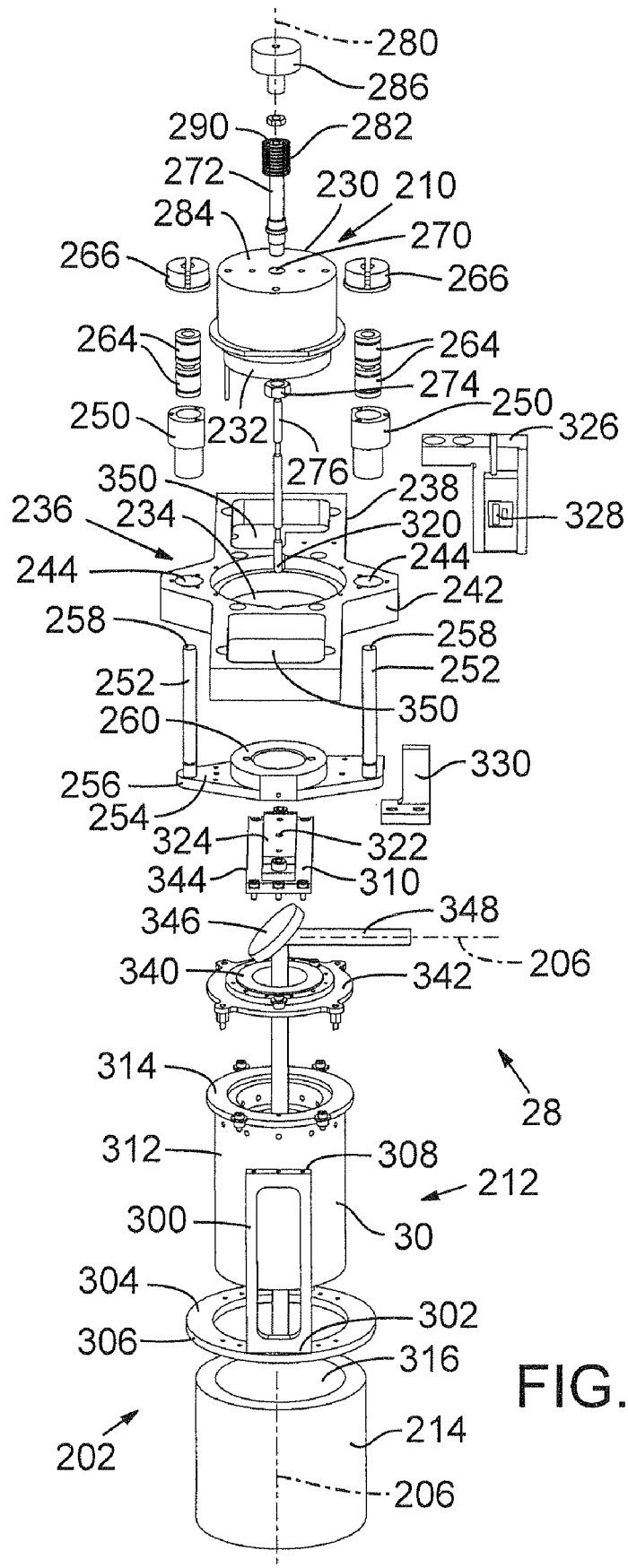
FIG. 6 is an exploded view of a preferred embodiment of a laser beam focal region control subsystem that includes an air bearing sleeve assembly housing a scan lens and guiding its vertical (Z-axis) motion.

FIG. 6 shows in greater detail the components of control subsystem 28 and its mounting on laser optics assembly stage 22. With reference to FIG. 6, control subsystem 28 includes a lens forcer assembly 210 that is coupled by a yoke assembly 212 to scan lens 30 contained in the interior of an air bushing 214 of air bearing assembly 202. A suitable air bushing is Part No. S307501, available from New Way Machine Components, Inc., Aston, Pa. Lens forcer assembly 210, which is preferably a voice coil actuator, imparts by way of yoke assembly 212 a motive force that moves scan lens 30 and thereby the focal region of the laser beam to selected positions along beam axis 206.

Voice coil actuator 210 includes a generally cylindrical housing 230 and an annular coil 232 formed of a magnetic core around which copper wire is wound. Cylindrical housing 230 and annular coil 232 are coaxially aligned, and annular coil 232 moves axially in and out of housing 230 in response to control signals (not shown) applied to voice coil actuator 210. A preferred voice coil device 210 is an Actuator No. LA 28-22-006 Z, available from BEI Kimco Magnetics, Vista, Calif.

Annular coil 232 extends through a generally circular opening 234 in a voice coil bridge 236 having opposite side members 238 that rest on uprights 240 (FIG. 1) mounted on laser optics assembly stage 22 to provide support for laser beam focal region control subsystem 28. Voice coil bridge 236 includes in each of two opposite side projections 242 a hole 244 containing a tubular housing 250 through which passes a rod 252 extending from an upper surface 254 of a guiding mount 256. Each rod 252 has a free end 258. Guiding mount 256 has on its upper surface 254 an annular pedestal 260 on which annular coil 232 rests. Two stacked, axially aligned linear ball bushings 264 fit in tubular housing 250 contained in each hole 244 of side projections 242 of voice coil bridge 236. Free ends 258 of rods 252 passing through ball bushings 264 are capped by rod clamps 266 to provide a hard stop of lower travel limit of annular coil 232 along beam axis 206.

Housing 230 has a circular opening 270 that is positioned in coaxial alignment with the center of annular coil 232, opening 234 of voice coil bridge 236, and the center of annular pedestal 260 of guiding mount 256. A hollow steel shaft 272 extends through opening 270 of housing 230, and a hexagonal nut 274 connects in axial alignment hollow steel shaft 272 and a flexible tubular steel member 276, which is coupled to yoke assembly 212 as further described below. Hexagonal nut 274 is positioned in contact with a lower surface 278 of annular coil 232 to drive flexible steel member 276 along a drive or Z-axis 280 in response to the in-and-out axial movement of annular coil 232. Hollow steel shaft 272 passes through the center and along the axis of a coil spring 282, which is confined between a top surface 284 of housing 230 and a cylindrical spring retainer 286 fixed at a free end 290 of hollow steel shaft 272. Coil spring 282 biases annular coil 232 to a mid-point of its stroke along Z-axis 280 in the absence of a control signal applied to voice coil actuator 210.

Yoke assembly 212 includes opposed yoke side plates 300 (only one shown) secured at one end 302 to a surface 304 of a yoke ring 306 and at the other end 308 to a multilevel rectangular yoke mount 310. Scan lens 30 formed with a cylindrical periphery 312 and having an annular top flange 314 fits in yoke assembly 212 so that top flange 314 rests on surface 304 of yoke ring 306. Scan lens 30 contained in the interior of air bushing 214 forms the inner race of air bearing assembly 202, and an inner surface 316 of air bushing 214 forms the outer race of air bearing assembly 202. The implementation of air bearing assembly 202 increases the rigidity of scan lens 30 in the X-Y plane but allows scan lens 30 to move along the Z-axis in a very smooth, controlled manner.

Flexible steel member 276 has a free end 320 that fits in a recess 322 in an upper surface 324 of yoke mount 310 to move it along Z-axis 280 and thereby move scan lens 30 along beam axis 206. An encoder head mount 326 holding an encoder 328 and attached to voice coil bridge 236 cooperates with an encoder body mount 330 holding an encoder scale and attached to guiding mount 256 to measure, using light diffraction principles, the displacement of guiding mount 256 relative to voice coil bridge 236 in response to the movement of annular coil 232. Because flexible tubular steel member 276 is attached to annular coil 232, the displacement measured represents the position of scan lens 30 along beam axis 206.

A quarter-waveplate 340 secured in place on a mounting ring 342 is positioned between a lower surface 344 of rectangular yoke mount 310 and top flange 314 of scan lens 30. A beam deflection device 346, such as a piezoelectric fast steering mirror, attached to optics assembly stage 22 (FIG. 3) is positioned between rectangular yoke mount 310 and quarter-waveplate 340. Fast steering mirror 346 receives an incoming laser beam 348 propagating along beam axis 206 and directs laser beam 348 through quarter-waveplate 340 and scan lens 30. Quarter-waveplate 340 imparts circular polarization to the incoming linearly polarized laser beam, and fast steering mirror 346 directs the circularly polarized laser beam for incidence on selected locations of the work surface of a target specimen supported on specimen stage 26. When fast steering mirror 346 is in its neutral position, Z-axis 280, beam axis 206, and the propagation path of laser beam 348 are collinear. When fast steering mirror 346 is in operation, the propagation path of laser beam 348 is generally aligned with beam axis 206.

Flexible steel member 276 is rigid in the Z-axis direction but is compliant in the X-Y plane. These properties of flexible steel member 276 enable it to function as a buffer, isolating the guiding action of air bearing assembly 202 containing scan lens 30 from the guiding action of lens forcer assembly 210 that moves scan lens 30.

Lens forcer assembly 210 and air bearing assembly 202 have centers of gravity and are positioned along the Z-axis. Voice coil bridge 236 of lens forcer assembly 210 has two depressions 350, the depths and cross sectional areas of which can be sized to achieve the axial alignment of the two centers of gravity. Such center of gravity alignment eliminates moment arms in control system 28 and thereby helps reduce propensity of low resonant frequency vibrations present in prior art cantilever beam designs.

Several examples of possible types of laser processing systems in which positioning system 10 can be installed include semiconductor wafer or other specimen micromachining, dicing, and fuse processing systems. In a wafer dicing system, laser beam 348 moves along scribe locations on the wafer surface. In a wafer fuse processing system, a pulsed laser beam 348 moves relative to wafer surface locations of fuses to irradiate them such that the laser pulses either partly or completely remove fuse material.

It will be obvious to those having skill in the art that many changes may be made to the details of the above-described embodiments without departing from the underlying principles of the invention. The scope of the present invention should, therefore, be determined only by the following claims.

The invention claimed is:

1. A decoupled, multiple stage positioning system, comprising:
   a dimensionally stable substrate having a substrate thickness and opposite first and second substantially parallel major surface portions;
   a first guide track assembly coupled to the first major surface portion and positioned to guide motion of a first stage along a first axis in response to a first motive force;

a second guide track assembly coupled to the second major surface portion and positioned to guide motion of a second stage along a second axis in response to a second motive force, and the second and first axes transversely arranged relative to each other; and the dimensionally stable substrate decoupling the first and second stages so that the guided motions of the first and second stages contribute negligible error motion in a direction along the substrate thickness.

2. The positioning system of claim 1, further comprising:
a first motor drive operatively associated with the first guide track assembly to provide the first motive force to which the first stage responds; and
a second motor drive operatively associated with the second guide track assembly to provide the second motive force to which the second stage responds.

3. The positioning system of claim 2, in which each of the first and second motor drives includes a linear motor.

4. The positioning system of claim 2, in which the first motor drive includes two motors positioned at either side of the first guide track assembly to impart the first motive force to the first stage and guide its motion along the first axis, and in which the second motor drive includes two motors positioned at either side of the second guide track assembly to impart the second motive force to the second stage and guide its motion along the second axis.

5. The positioning system of claim 4, in which the first stage has a first center of mass, and in which the first motor drive includes two motors positioned at either side of the first guide track assembly to impart the first motive force substantially through the first center of mass of the first stage to guide its motion along the first axis.

6. The positioning system of claim 5, in which the second stage has a second center of mass, and in which the second motor drive includes two motors positioned at either side of the second guide track assembly to impart the second motive force substantially through the second center of mass of the second stage to guide its motion along the second axis.

7. The positioning system of claim 4, further comprising a position sensor positioned near each of the two motors of the first motor drive and near each of the two motors of the second motor drive.

8. The positioning system of claim 7, in which the position sensors and motors cooperate to provide co-located feedback control.

9. The positioning system of claim 7, in which the position sensors and motors of each of the first and second motor drives cooperate to regulate three-dimensional motions of the first and second stages, respectively.

10. The positioning system of claim 1, in which at least one of the first and second guide track assemblies includes an air bearing associated with an air bearing guideway.

11. The positioning system of claim 10, in which the air bearing is of a vacuum pre-loaded type.

12. The positioning system of claim 10, in which the air bearing is of a magnetically pre-loaded type.

13. The positioning system of claim 10, in which the air bearing guideway is a surface of the substrate.

14. The positioning system of claim 13, in which the surface of the substrate, when in a horizontal disposition, constitutes a lower substrate surface and the air bearing develops sufficient force to overcome gravitational force on the one of the first and second stages with which the air bearing is included.

15. The positioning system of claim 1, in which the substrate includes a stone slab.

16. The positioning system of claim 15, in which the stone slab is formed of granite.

17. The positioning system of claim 1, in which the substrate includes a slab of ceramic material.

18. The positioning system of claim 1, in which the substrate includes a slab made of cast iron.

19. The positioning system of claim 1, in which the substrate includes a slab made of a polymer composite material.

20. The positioning system of claim 1, in which the substrate is configured to provide operational clearance that affords the guided motion of the first and second stages.

21. The positioning system of claim 20, in which the substrate includes a slot through which a component operatively connected to one of the first and second stages can move in operative association with the other one of the first and second stages.

22. The positioning system of claim 1, in which:
the first and second stages support components of a laser processing system, the first stage supporting a scan lens that has a beam axis and through which a laser beam propagates along a propagation path generally aligned with the beam axis, and the second stage supporting a specimen-holding chuck; and
the guided motions of the first and second stages cooperating to move the beam axis relative to laser beam processing locations on a surface of a specimen held by the chuck.

23. The positioning system of claim 22, in which the laser processing system performs micromachining of the specimen.

24. The positioning system of claim 1, in which:
the first and second stages support components of a semiconductor wafer dicing system, the first stage supporting a cutting device and the second stage supporting a wafer-holding chuck; and
the guided motions of the first and second stages cooperating to move the cutting device along wafer scribe locations on a surface of a wafer held by the chuck to dice the wafer.

25. The positioning system of claim 1, in which:
the first and second stages support components of a semiconductor wafer fuse processing system, the first stage supporting a wafer fuse processing device and the second stage supporting a semiconductor wafer-holding chuck; and
the guided motions of the first and second stages cooperating to move the wafer fuse processing device relative to fuse locations on a surface of a semiconductor wafer held by the chuck; and
the guided motions of the first and second stages cooperating to move the beam axis relative to laser beam processing locations on a surface of a specimen held by the chuck.

26. The positioning system of claim 25, in which the wafer fuse processing device performs semiconductor wafer fuse irradiation.

27. The positioning system of claim 22, in which the scan lens forms part of an optical assembly that, together with the first stage, defines a first center of mass, and in which the beam axis and first center of mass coincide with each other.

* * * * *